(12) United States Patent
Ananthapadmanabha Rao et al.

(10) Patent No.: US 12,317,756 B2
(45) Date of Patent: May 27, 2025

(54) SUPERCONDUCTING CHIP PACKAGE WITH IMPROVED MAGNETIC SHIELDING

(71) Applicant: IMEC VZW, Leuven (BE)

(72) Inventors: Vadiraj Manjunath Ananthapadmanabha Rao, Leuven (BE); Steven Van Winckel, Tielt-Winge (BE); Steven Brebels, Heverlee (BE)

(73) Assignee: IMEC VZW, Leuven (BE)

( * ) Notice: Subject to any disclaimer, the term of this patent is extended or adjusted under 35 U.S.C. 154(b) by 393 days.

(21) Appl. No.: 18/055,961

(22) Filed: Nov. 16, 2022

(65) Prior Publication Data

US 2023/0270020 A1   Aug. 24, 2023

(51) Int. Cl.
*H10N 60/81* (2023.01)

(52) U.S. Cl.
CPC .................................. *H10N 60/81* (2023.02)

(58) Field of Classification Search
None
See application file for complete search history.

(56) References Cited

U.S. PATENT DOCUMENTS

| | | | |
|---|---|---|---|
| 11,152,707 B1 | 10/2021 | Janett et al. | |
| 2020/0152540 A1* | 5/2020 | Nah | ..................... H01L 21/6835 |
| 2021/0399193 A1* | 12/2021 | Nanba | ................ H01L 23/49822 |
| 2021/0408358 A1* | 12/2021 | Nanba | ................. H10N 60/0156 |
| 2022/0059465 A1* | 2/2022 | Abraham | .............. H01L 23/552 |

FOREIGN PATENT DOCUMENTS

| | | |
|---|---|---|
| CN | 213782007 U | 7/2021 |
| WO | 2022038062 A2 | 2/2022 |

OTHER PUBLICATIONS

Extended European Search Report and Written Opinion, Application No. EP 21210843.5, mailed May 31, 2022, 5 pages.

* cited by examiner

*Primary Examiner* — Benjamin P Sandvik
(74) *Attorney, Agent, or Firm* — McDonnell Boehnen Hulbert & Berghoff LLP

(57) ABSTRACT

A package includes a metal plate and a carrier substrate mounted on the top surface thereof, which includes one or more superconducting chips mounted on the carrier substrate or configured to receive the one or more chips mounted thereon. The carrier substrate and the plate are sandwiched between the planar portions of a first and second magnetic shield structure, at least the first structure including a planar portion and a receptacle-shaped shell portion arranged above and around the chip location. The package includes one or more pillars formed of a magnetic shielding material which are clamped between the planar portions of the shield structures, wherein the one or more pillars are penetrating the carrier substrate and the metal support plate, and wherein the one or more pillars are in physical contact with both of the planar portions.

20 Claims, 4 Drawing Sheets

SUPERCONDUCTING CHIP PACKAGE WITH IMPROVED MAGNETIC SHIELDING

CROSS-REFERENCE TO RELATED APPLICATIONS

The present application is a non-provisional patent application claiming priority to European Patent Application No. EP 21210843.5, filed Nov. 26, 2021, the contents of which are hereby incorporated by reference.

FIELD OF THE DISCLOSURE

The present disclosure is related to a package for housing one or more superconducting chips, for example qubit chips which are applicable in quantum computing, quantum metrology and quantum sensing.

BACKGROUND

Artificial atoms based on superconducting qubits have emerged as one of the promising candidates in the pursuit of developing large-scale quantum processors for demonstrating quantum-enhanced performance over classical computing algorithms. These qubits are engineered to have transition energies in the microwave regime and are fabricated using techniques borrowed from conventional complementary metal-oxide semiconductor (CMOS) processing. Major developments in material science, microwave circuit design, control and readout electronics, among many others, have pushed the coherence times of superconducting qubits beyond the 1 ms barrier, ushering in an era where large-scale development and deployment of these qubit processors is now possible. Qubits are arranged on a chip, referred to as a "qubit chip."

One of the main factors limiting the coherence times of superconducting qubits is their sensitivity to environmental electromagnetic (EM) and thermal noise. To minimize thermal noise, the qubit chip is cooled to a temperature ~10 mK in a dilution refrigerator. In one well-known configuration, the chip is enclosed in a metallic sample box which is then attached to the lowest temperature stage of the dilution refrigerator. This is followed by several layers of electrical and magnetic shields on different thermal stages to further attenuate the impact of external EM and thermal noise. The sample box and the electrical shields are typically made from oxygen-free-high-conductivity (OFHC) copper whereas the magnetic shields are built from superconducting materials and/or high magnetic permeability nickel alloy materials. These shielding options are bulky and consume much of the limited experimental space available in dilution refrigerators.

Typically, the sample box, which houses the chip and the coplanar-waveguide (CPW) based printed-circuit board (PCB) with connectors (for signal routing), is placed inside a cylindrical-shaped magnetic shield. This forces the cables providing the necessary control and readout signals to the chip/PCB to be routed inside the cylindrical-magnetic shield. Here, the sample box also serves to shield the PCB from EM noise. This setup may be used for a sample box with a compact-connectorized PCB. However, as the number of qubits on chip increases, the number of connectors and cables required also increases, which soon becomes a bottleneck when using cylindrical shields.

Many leading academic and industrial quantum computing groups have migrated from a CPW PCB inside a sample box to a multi-layer stripline PCB or embedded CPW based PCB, which is mounted on an OFHC copper plate for proper thermalization and mechanical support. The stripline or embedded CPW construction shields the PCB from EM noise which eliminates the requirement of a sample box for mechanical housing and shielding of the PCB. As the PCB in most cases does not involve superconducting materials, it does not require any additional magnetic shielding. The task then is to only shield the superconducting chip from EM noise using appropriate electrical and magnetic shields. The size of the PCB can be designed to house multiple connectors that are mounted along its periphery which opens the route for high-density connectivity. The shields are thermalized using the conduction path from the PCB as well as the screws which hold them in place. The superconducting chip(s) is/are at the center of the package, in plane with the PCB.

However, such a package design typically suffers from a magnetic shielding deficiency for the qubit chip(s) due to the very nature of its construction and arrangement. As will be explained in more detail hereafter, the unavoidable gap between the shields due to the thickness of the copper mounting plate significantly degrades the shielding properties due to magnetic field leakage. The above described problems may be encountered for the shielding of qubit chips as well as to any other type of superconducting chip.

SUMMARY

The present disclosure aims to address the above-described problem. This aim is achieved by a package in accordance with the appended claims. A package according to some embodiments comprises a metal plate and a carrier substrate, for example a PCB, mounted on the top surface thereof, comprising one or more superconducting chips mounted on the carrier substrate or wherein the carrier substrate is configured to receive the one or more chips mounted thereon. A superconducting chip is defined in the present context as a semiconductor chip comprising electrically conductive materials which are suitable for exhibiting superconductivity at a given temperature range, which may be a cryogenic temperature range, for example in the order of 10 or a few tens of Kelvin. One example of a superconducting chip within this meaning is a qubit chip as referred to in the introduction.

The carrier substrate and the plate are sandwiched between the planar portions of a first and second magnetic shield structure, at least the first structure comprising a planar portion and a receptacle-shaped shell portion arranged above and around the chip location. The package comprises pillars formed of a magnetic shielding material which are clamped between the planar portions of the shield structures, wherein the one or more pillars are penetrating the carrier substrate and the metal support plate and wherein the one or more pillars are in physical contact with both of the planar portions. According to an embodiment, the pillars are hollow cylinders arranged around the screws of screw connections which realize a clamping force between the planar portions of the first and second shield structure.

A "magnetic shielding material" in the present context is a material that exhibits high magnetic permeability at the cryogenic operational temperature of the superconducting chip(s). In some embodiments, the relative permeability of the material is of the order of 80.000 to 100.000 at about 1 mK.

As the pillars are formed of high magnetic permeability material, the pillars form a low reluctance path between the first and second shield structure and thereby enable to decrease the magnetic field inside the shell portion drastically at the cryogenic operational temperatures of the chip or chips, compared to a package that is not provided with the pillar(s).

The disclosure relates to a package comprising or configured to receive one or more superconducting chips, the package comprising:
- a carrier substrate comprising one or more superconducting chips mounted thereon or suitable for mounting one or more superconducting chips thereon,
- a metal support plate having a front and back surface, with the carrier substrate mounted on the front surface of the metal support plate, the metal support plate being configured to be coupled to a low temperature stage of a refrigerating apparatus,
- a first shield structure formed of a magnetic shielding material, comprising a receptacle-shaped shell portion, and a planar shield portion extending laterally outward from the rim of the shell portion, wherein the interior of the shell portion forms a cavity extending above and around the location of the one or more superconducting chips,
- a second shield structure formed of a magnetic shielding material and comprising at least a second planar shield portion, wherein:
the carrier substrate and the metal support plate are sandwiched between the first and second planar shield portions,
a plurality of pillars formed of a magnetic shielding material are clamped between the first and second planar shield portions, wherein the pillars are:
penetrating the carrier substrate and the metal support plate,
in physical contact with both of the first and second planar shield portions.

According to an embodiment, the pillars have the shape of hollow cylinders and wherein the planar shield portions are clamped together by screw connections comprising screws which are inserted through the hollow cylinders.

According to an embodiment, the pillars are distributed at regular intervals along the circumference of the shell portion of the first shield structure.

According to an embodiment, the carrier substrate is a multilayer stripline PCB.

According to an embodiment, the package further comprises an additional shield mounted inside the shell portion of the first shield structure. The additional shield may be formed of a metal that acquires superconducting properties below a transition temperature.

According to an embodiment, the second shield structure comprises a second receptacle shaped shell portion with the second planar shield portion of the second structure extending outward from the rim of the second shell portion, wherein the shield structures, and wherein the interior of the second shell portion forms a cavity extending on the other side of the metal support plate and opposite the cavity formed by the first shell portion.

The package according to the previous embodiment may further comprise an additional shield mounted inside the second shell portion, the additional shield being formed of a metal that acquires superconducting properties below a transition temperature According to an embodiment, the carrier substrate comprises a plurality of connectors for connection of the carrier substrate to one or more external apparatuses.

Other features will be apparent from the following detailed disclosure, from the attached claims, and from the drawings.

BRIEF DESCRIPTION OF THE DRAWINGS

The above, as well as additional features will be better understood through the following illustrative and non-limiting detailed description, with reference to the appended drawings. In the drawings like reference numerals will be used for like elements unless stated otherwise.

DETAILED DESCRIPTION

Figure 1A:
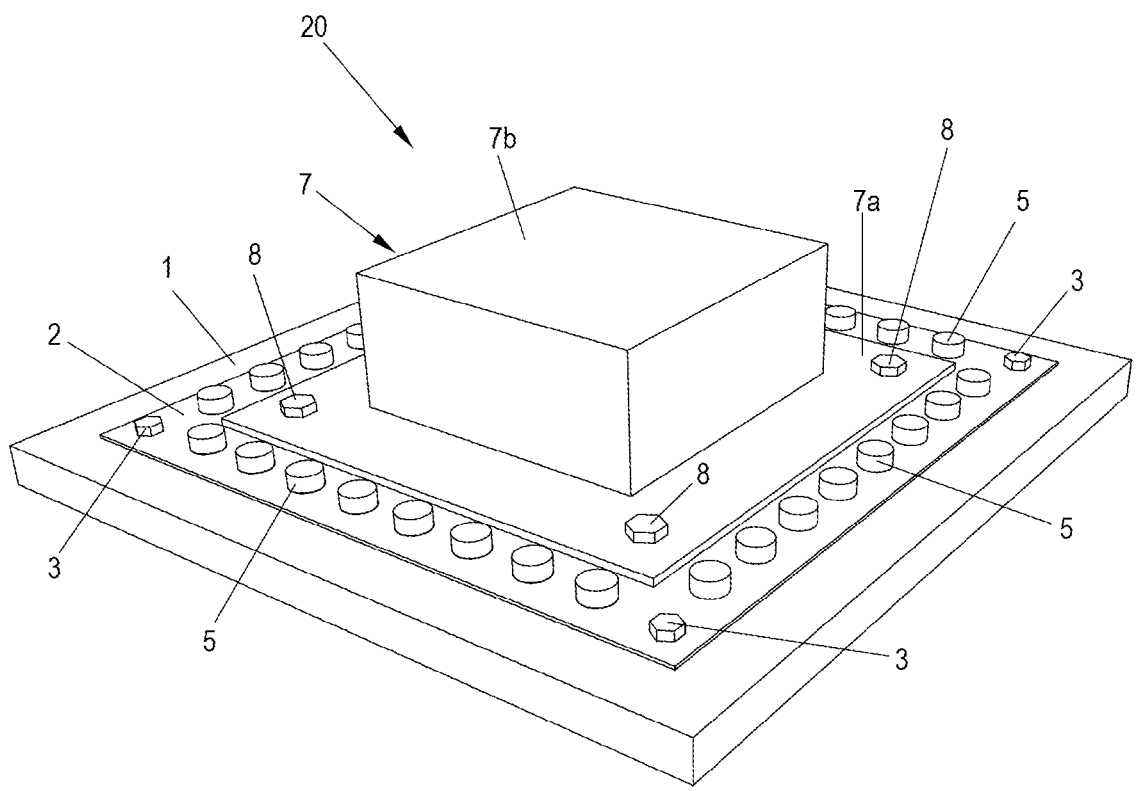
FIG. 1A illustrates a superconducting chip package that exhibits the disadvantages described in the introduction.
Figure 1B:
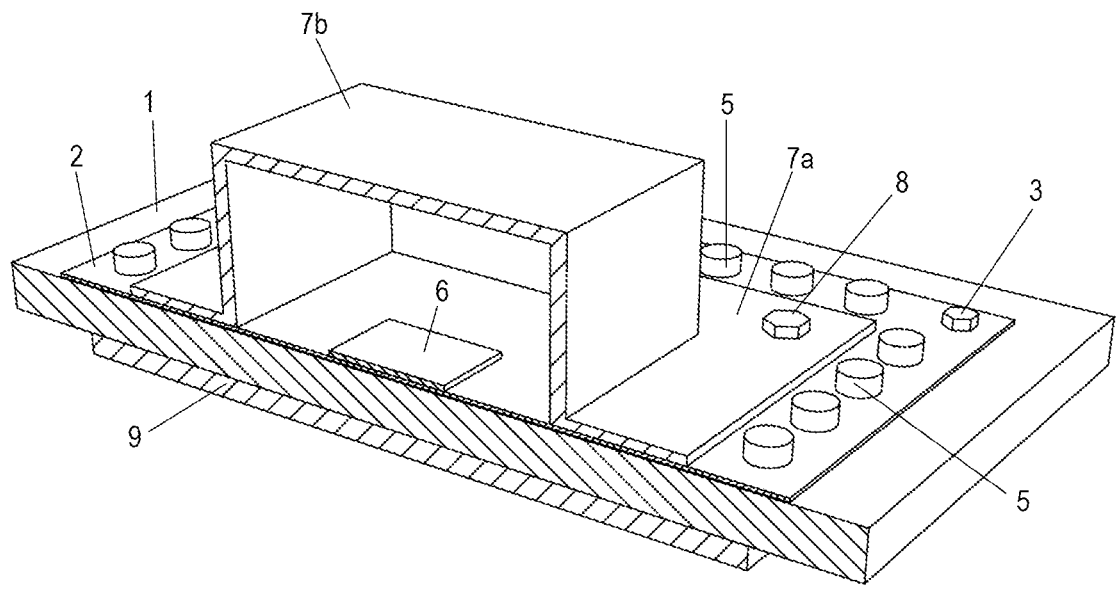
FIG. 1B illustrates a superconducting chip package that exhibits the disadvantages described in the introduction.

A superconducting chip package 20 is illustrated in FIGS. 1A and 1B, respectively showing the outer appearance of the package 20 and a 3D section view. The package 20 exhibits the disadvantages described above, as will be explained in more detail hereafter. The package comprises a square OFHC copper plate 1. On the top surface thereof, a square PCB 2 is arranged and attached to the copper plate 1 by four screw connections 3 in the respective four corners of the PCB.

The PCB 2 is one example of the "carrier substrate" disclosed herein, and may be a stripline PCB for example, or an embedded CPW PCB. Other types of carrier substrates may be utilized with the present examples. A general characteristic of the carrier substrate is that it comprises transmission lines for transmitting high frequency electrical signals, wherein the transmission lines are shielded from EM noise as a consequence of the design of the carrier, as is the case for the stripline PCB and embedded CPW PCB for example. However other carrier options associated with chip packaging techniques that comply with this requirement may be applied (e.g., low temperature co-fired ceramics (LTCC) circuits, micromachined stacked substrates with substrate vias, or others).

The PCB 2 is provided with four rows of electrical connectors 5, one row extending along each side, which are connected via electrical conductors (not shown) incorporated in the PCB, to a superconducting chip 6 mounted centrally on the PCB 2. The connectors 5 are represented in a simplified way as cylindrical structures protruding from the PCB surface and are in reality formed as suitable connectors configured to receive a matching connector coupled to an electrical wire. The chip 6 is shielded from external magnetic fields by a shield structure 7 comprising a planar support portion 7a and a receptacle shaped shell portion 7b placed above and around the chip location. The planar portion 7a extends outward from the rim of the shell portion 7b. The planar dimensions of the PCB 2 may for example be in the order of 10×10 cm, with larger dimensions of the planar support portion 7a of the shield structure 7 and of the OFHC plate 1 which may be in accordance with the image shown.

The shield structure 7 is formed of a material that exhibits high magnetic permeability, and thus low reluctance, at cryogenic temperatures, down to the operational temperature of the superconducting chip 6 when the package is mounted on a dilution refrigerator stage. Relative permeability values required for the purpose of shielding operational superconducting chips are in the order of 80.000 to 100.000. Materials of this type are for example Nickel-based alloys of a specific composition and available under the name CRYOPERM, which exhibit permeability in the order of the above-named values at the required cryogenic temperature. The planar support portion 7a of the shield structure 7 is placed on the PCB 2 and is attached by screw connections 8 to a shield plate 9 lying on the opposite side of the package, and formed of the same material as the shield structure 7 or of a material having the same high permeability properties at cryogenic temperatures.

The PCB 2 and the OFHC plate 1 are thus sandwiched and clamped between a first shield structure 7 and a second shield structure 9 by a clamping force exhibited by the screw connections 8.

Because of their high magnetic permeability, the shield structure 7 and the lower shield plate 9 act to deflect stray magnetic field lines coming from external sources away from the superconducting chip 6. However, in the case of the package shown in FIGS. 1A and 1B, the low reluctance path between the shields 7 and 9 is broken by the PCB 2 and the OFHC plate 1 whose relative permeability value is about 1. Therefore, the effective shielding inside the shield shown in FIGS. 1A and 1B is degraded due to field lines leaking into the shield through the PCB 2 and the OFHC plate 1.

Figure 2:
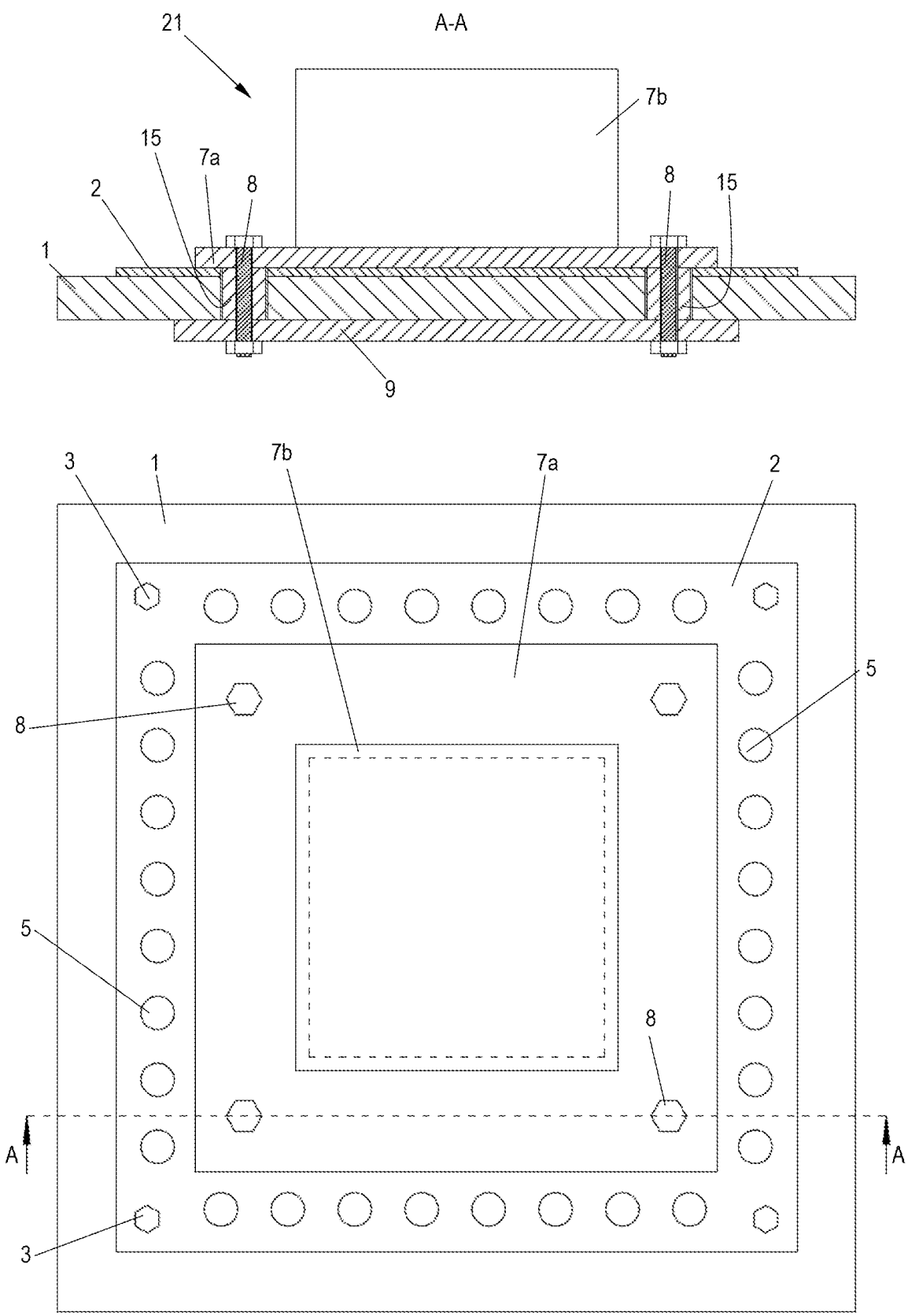
FIG. 2 illustrates a package, according to example embodiments.
Figure 3:
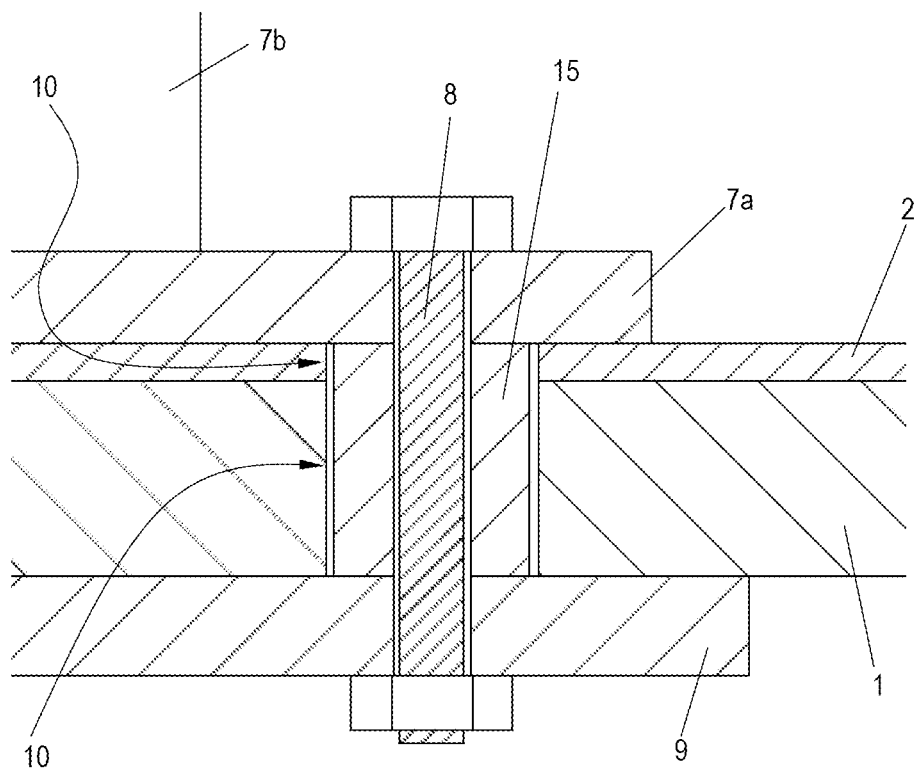
FIG. 3 is a detailed view of the area surrounding one of the pillars shown in the section view of FIG. 2, according to example embodiments.

FIG. 2 shows a top view and section view of a superconducting chip package 21 in accordance with an example embodiment. The components described above in relation to the package shown in FIG. 1 are indicated by the same reference numerals. The above descriptions of these components are valid also for the package of FIG. 2. In addition, the package 21 comprises hollow cylindrical pillars 15 which penetrate the PCB 2 and the OFHC plate 1. The pillars 15 are clamped between and in physical contact with the planar support portion 7a of the shield structure 7 and the lower shield plate 9. A detail of the package in the vicinity of one of the pillars 15 is shown in FIG. 3. The holes 10 provided in the OFHC plate 1 and the PCB 2 for the passage of the screws of the screw connections 8 have a higher diameter than the same holes in the package of FIGS. 1A and 1B, to allow the passage of the pillars 15 through the holes 10. The screws of the screw connections 8 are inserted through the hollow pillars 15. A small air gap between the pillars 15 and the sidewalls of the holes 10 is permitted so that the pillars may be inserted into the holes by manual manipulation. Alternatively, the pillars 15 could be produced by filling the holes 10 with a high permeability material using for example plating or printing techniques.

The material of the pillars 15 may be a magnetic shielding material having high permeability at cryogenic temperatures (e.g., it may be the same material as the material of the shield structure 7 and/or the lower shield plate 9).

The pillars 15 may create a low reluctance path from the upper part of the package to the lower part, thereby controlling the magnetic field attenuation inside the cavity of the shell portion 7b.

Figure 4:
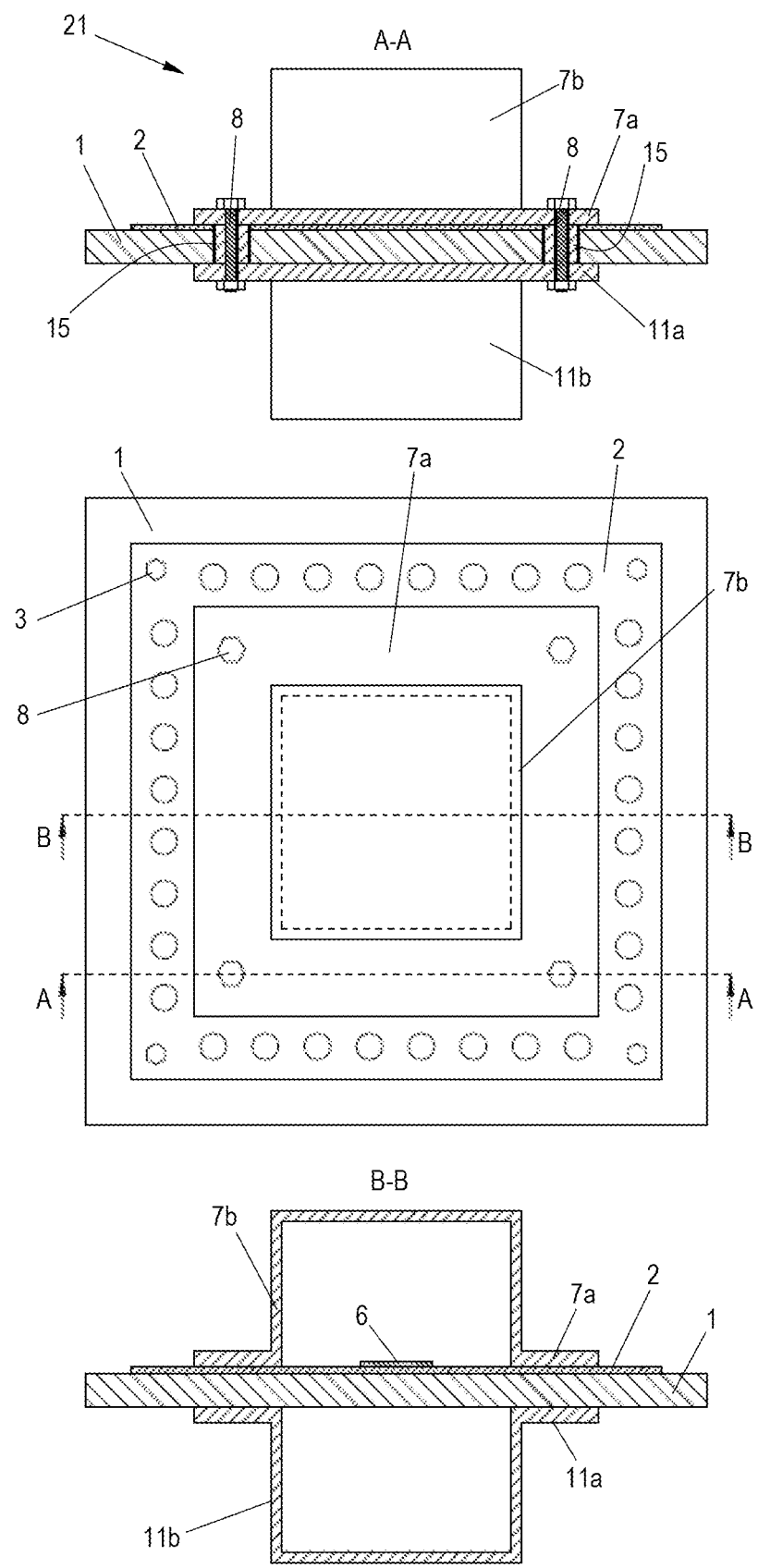
FIG. 4 illustrates another package in which the shield structures on either side of the superconducting chip are both provided with a shell portion, according to example embodiments.

FIG. 4 illustrates a package 21 according to another example embodiment. The figure includes a top view and two section views through respective section planes A-A and B-B. According to this embodiment, the lower shield plate 9 is replaced by a shield structure 11 that has the same shape as the shield structure 7, comprising a planar support portion 11a and a receptacle-shaped shell portion 11b. The shield structures are arranged in mirrored fashion on either side of the stack comprising the OFHC plate 1 and the PCB 2, and clamped together by the screw connections 8. As in the previous embodiment, low reluctance pillars 15 are present, this time clamped between and in physical contact with the planar shield support portions 7a and 11a.

From simulations performed on the configuration of FIG. 4 with and without the pillars 15, it was found that the pillars 15 are capable of increasing the level of magnetic field attenuation at the location of the chip 6 by upwards of 200 times the value applicable without the pillars. This unexpectedly high impact therefore represents a significant improvement over the prior art configuration.

The effect may be further increased by increasing the number of pillars 15 and/or reducing the gap between the shield portions 7a and 11a (or 7a and 9 in the embodiment of FIG. 2). Other ways of enhancing the effect may include applying multiple rows of pillars, possibly applying at least two rows which are staggered one with respect to the other.

The number of pillars is not limited to any particular number or range. Any number of pillars is possible that can be implemented in view of the dimensions of a particular package. The pillars may be arranged at regular intervals around the shell portion 7a of the upper shield structure 7. The dimensions of the pillars are also not limited to any particular value or range.

The pillars 15 are depicted as hollow cylinders arranged around the screws of the screw connections 8; however, other configurations may be implemented. Pillars of the same shape, or of another shape may be clamped between the planar shield portions 7a and 11a (or 7a and 9) at other locations than the locations of the screw connections 8. It will be understood that placing the pillars as close as possible to the screw connections ensures that the clamping force is highest at these locations thereby minimizing the leakage of magnetic field lines through the interfaces between the pillars 15 and the upper and lower shield structures 7 and 11 (or 7 and 9). In this respect, the examples wherein the pillars are hollow cylinders 15 arranged around the screws represents a preferred version. Other possible shapes of pillars are full cylinders or rectangular blocks. The pillars may include planar upper and lower surfaces which can be placed in full contact with the upper and lower planar shield portions 7a and 11a (or 7a and 9).

According to another embodiment, the pillars 15 are located as far away as possible from the superconducting chip(s) 6.

The pillars 15 need not be formed as integral pieces of low reluctance material. For example the hollow cylindrical pillars 15 may be formed from a plurality of rings of the material stacked together. The latter approach may be applied also for producing pillars of other shapes, by stacking strips of the low reluctance material together and connecting them by a tack weld or the like Pillars may be produced in this way when the particular material does not allow the production of integral pieces having the required height corresponding to the width of the gap between the shield portions 7a and 11a (or 7a and 9).

The examples disclosed may further include other mechanical clamping devices may be applied which clamp the upper and lower shields together in a reversible way, i.e., allowing the package to be disassembled and re-assembled.

The disclosed examples are related to such a package, i.e., a package that can be disassembled and re-assembled, either containing one or more superconducting chips 6 mounted on the PCB 2 or without such chips mounted on the PCB.

A package may however also be a package that is not configured to be disassembled, but wherein the upper and lower shields are clamped together permanently, such as by welding, and wherein one or a plurality of low reluctance pillars is arranged between the permanently assembled shield portions.

In the example illustrated in FIG. 4, the shield structures on either side of the chip(s) 6 need not be exactly the same in shape in dimensions. More generally stated, an example as shown in FIG. 4 may comprise shield structures on both sides of the metal plate 1, the structures forming mutually facing cavities formed by the shell portions (e.g., portions 7b, 11b in FIG. 4) of the respective shield structures.

FIG. 4 further depicts a second PCB comprising a second superconducting chip or set of superconducting chips could be arranged on the other side of the OFHC plate 1, wherein the second superconducting chip is shielded by the shell portion 11b of the second shield structure 11.

The package 21 may further comprise an additional shield around the one or more superconducting chips 6 and formed inside the cavity of the shell portion 7b of the first shield structure 7. The additional shield is formed of a metal that may have superconducting properties at the cryogenic operational temperature of the superconducting chip or chips 6. Example materials include Al-based materials. The additional shield may be formed as a cage that is placed above and around the chip.

The use of such a superconducting shield inside a high permeability shield is known as such, as a way of further increasing the level of attenuation of magnetic fields at the location of the chip or chips and at the cryogenic operational temperature of the chips. However, the additional shield material only obtains its superconducting properties below a given transition temperature. The high permeability shield 7 is therefore instrumental in creating a low magnetic field environment for the superconducting shield when it transitions from a normal metal to the superconducting state as the dilution refrigerator cools down below the transition temperature of the superconducting metal. The low magnetic environment minimizes the appearance of flux traps in the superconducting shield which could potentially cause the qubits to decohere. When the pillars are used in combination with a superconducting shield, the background field is drastically reduced compared to a package that does not comprise the pillars, which increases the efficiency of the superconducting shield significantly.

Alternatively, the additional shield inside the high permeability shield may be formed of a metal that does not have superconductive properties at the chip's operational temperature, such as copper.

If the electrical conductors on the superconducting chip or chips 6 are shielded by shielding material that is integrated in the chip itself, the additional shield inside the high permeability shield 7 could be omitted.

FIG. 4 further depicts that superconducting shields may be added in the cavities of both the upper and lower high permeability shell portions 7b and 11b.

The shape of the high permeability shell portion 7b or of both shell portions 7b and 11b in the as depicted in FIG. 4 is not limited to the shape of a rectangular box. Any other receptacle shape may be applied instead of the one illustrated in the drawings.

FIG. 4 further depicts that the shield structures 7 and 11 need not be identical in terms of their shape and dimensions.

While the disclosure has been illustrated and described in detail in the drawings and foregoing description, such illustration and description are to be considered illustrative and not restrictive. Other variations to the disclosed embodiments can be understood and effected by those skilled in the art, from a study of the drawings, the disclosure, and the appended claims. In the claims, the word "comprising" does not exclude other elements or steps, and the indefinite article "a" or "an" does not exclude a plurality. The mere fact that certain measures are recited in different dependent claims does not indicate that a combination of these measures cannot be used. Any reference signs in the claims should not be construed as limiting the scope.

What is claimed is:

1. A package comprising or configured to receive one or more superconducting chips, the package comprising:
   a carrier substrate configured for mounting one or more superconducting chips thereon;
   a metal support plate having a front and back surface, wherein the carrier substrate is mounted on the front surface of the metal support plate, and wherein the metal support plate is configured to be coupled to a low temperature stage of a refrigerating apparatus;
   a first shield structure formed of:
      a magnetic shielding material, comprising a receptacle-shaped shell portion; and
      a first planar shield portion extending laterally outward from a rim of the receptacle-shaped shell portion, wherein an interior of the receptacle-shaped shell portion forms a cavity extending above and around the location of the one or more superconducting chips; and
   a second shield structure formed of a magnetic shielding material and comprising at least a second planar shield portion,
   wherein:
      the carrier substrate and the metal support plate are sandwiched between the first and second planar shield portions; and
      a plurality of pillars formed of a magnetic shielding material are clamped between the first planar shield portion and the second planar shield portion, and
   wherein the pillars are:
      penetrating the carrier substrate and the metal support plate; and
      in physical contact with the first planar shield portion and the second planar shield portion.

2. The package of claim 1, wherein the pillars have the shape of hollow cylinders.

3. The package of claim 2, wherein the planar shield portions are clamped together by screw connections comprising screws that are inserted through the hollow cylinders.

4. The package of claim 1, wherein the pillars are distributed at regular intervals along the circumference of the shell portion of the first shield structure.

5. The package of claim 1, wherein the carrier substrate is a multilayer stripline PCB.

6. The package of claim 1, wherein the package further comprises an additional shield mounted inside the shell portion of the first shield structure.

7. The package of claim 6, wherein the additional shield is formed of a metal that acquires superconducting properties below a transition temperature.

8. The package of claim 1, wherein the second shield structure comprises a second receptacle-shaped shell portion with the second planar shield portion of the second shield structure extending outward from a rim of the second shell portion, and wherein the interior of the second shell portion forms a cavity extending on the other side of the metal support plate and opposite the cavity formed by the shell portion of the first shield structure.

9. The package of claim 8, wherein the package further comprises a second additional shield mounted inside the second shell portion, and wherein the second additional shield is formed of a metal that acquires superconducting properties below a transition temperature.

10. The package of claim 1, wherein the carrier substrate comprises a plurality of connectors for connection of the carrier substrate to one or more external apparatuses.

11. A method for fabricating a package comprising or configured to receive one or more superconducting chips, the method comprising:

providing a carrier substrate configured for mounting one or more superconducting chips thereon;

mounting the carrier substrate to a front surface of a metal support plate, wherein the metal support plate is configured to be coupled to a low temperature stage of a refrigerating apparatus;

forming a first shield structure of:
      a magnetic shielding material comprising a receptacle-shaped shell portion; and
      a first planar shield portion extending laterally outward from a rim of the receptacle-shaped shell portion, wherein an interior of the receptacle-shaped shell portion forms a cavity extending around a mounting location of the one or more superconducting chips;

forming a second shield structure of a magnetic shielding material to define at least a second planar shield portion;

sandwiching the carrier substrate and the metal support plate in between the first planar shield portion and the second planar shield portion; and clamping a plurality of pillars formed of a magnetic shielding material between the first planar shield portion and the second planar shield portion, wherein the pillars:
      penetrate the carrier substrate and the metal support plate; and
      are in physical contact with the first planar shield portion and the second planar shield portion.

12. The method of claim 11, wherein the pillars have the shape of hollow cylinders.

13. The method of claim 12, wherein the planar shield portions are clamped together by screw connections comprising screws that are inserted through the hollow cylinders.

14. The method of claim 11, wherein the pillars are distributed at regular intervals along the circumference of the shell portion of the first shield structure.

15. The method of claim 11, wherein the carrier substrate is a multilayer stripline PCB.

16. The method of claim 11, further comprising mounting an additional shield inside the shell portion of the first shield structure.

17. The method of claim 16, wherein the additional shield is formed of a metal that acquires superconducting properties below a transition temperature.

18. The method of claim 11, wherein the second shield structure comprises a second receptacle-shaped shell portion with the second planar shield portion of the second shield structure extending outward from a rim of the second shell portion, and wherein the interior of the second shell portion forms a cavity extending on the other side of the metal support plate and opposite the cavity formed by the shell portion of the first shield structure.

19. The method of claim 18, further comprising mounting a second additional shield inside the second shell portion, wherein the second additional shield is formed of a metal that acquires superconducting properties below a transition temperature.

20. The method of claim 11, wherein the carrier substrate comprises a plurality of connectors for connection of the carrier substrate to one or more external apparatuses.

* * * * *